United States Patent [19]
Schäfer et al.

[11] Patent Number: 6,140,177
[45] Date of Patent: Oct. 31, 2000

[54] PROCESS OF FORMING A SEMICONDUCTOR CAPACITOR INCLUDING FORMING A HEMISPHERICAL GRAIN STATISTICAL MASK WITH SILICON AND GERMANIUM

[75] Inventors: Herbert Schäfer, Höhenkirchen-Siegertsbrunn; Martin Franosch, München; Reinhard Stengl, Stadtbergen; Volker Lehmann, München; Hans Reisinger, Grünwald; Hermann Wendt, Grasbrunn, all of Germany

[73] Assignee: Siemens Aktiengesellschaft, Munich, Germany

[21] Appl. No.: 09/242,153
[22] PCT Filed: Jul. 3, 1997
[86] PCT No.: PCT/DE97/01408
 § 371 Date: Feb. 9, 1999
 § 102(e) Date: Feb. 9, 1999
[87] PCT Pub. No.: WO98/07184
 PCT Pub. Date: Feb. 19, 1998

[30] Foreign Application Priority Data

Aug. 14, 1996 [DE] Germany ............... 196 32 835

[51] Int. Cl.⁷ ................................. H01L 21/8242
[52] U.S. Cl. .................. 438/253; 438/396; 438/398; 438/947
[58] Field of Search ................. 438/293, 396, 438/700, 702, 947, 295, 398

[56] References Cited

U.S. PATENT DOCUMENTS

| | | | |
|---|---|---|---|
| 5,130,885 | 7/1992 | Fazan et al. | 361/313 |
| 5,134,086 | 7/1992 | Ahn | 438/318 |
| 5,158,905 | 10/1992 | Ahn | 438/396 |
| 5,254,503 | 10/1993 | Kenney | 438/398 |
| 5,346,846 | 9/1994 | Park et al. | 438/396 |
| 5,358,888 | 10/1994 | Ahn et al. | 438/396 |
| 5,702,968 | 12/1997 | Chen | 438/253 |
| 5,770,500 | 6/1998 | Batra et al. | 438/255 |

FOREIGN PATENT DOCUMENTS

| | | |
|---|---|---|
| 0 415 530 B1 | 3/1991 | European Pat. Off. . |
| 0 567 748 A1 | 11/1993 | European Pat. Off. . |
| 42 22 584 A1 | 1/1993 | Germany . |

OTHER PUBLICATIONS

Japanese Journal of Applied Physics, T. Mine et al, "Capacitance–Enhanced Stacked–Capacitor with Engraved Storage Electrode for Deep Submicron DRAMs", pp. 137–140.

IEDM (1985), VLSI Research Center, Toshiba Corp., Japan, K. Yamada et al, "A Deep–Trenched Capacitor Technology for 4 Mega Bit Dynamic Ram", pp. 702–705.

The Electrochemical Society, Inc., vol. 143, No. 2, Feb. (1996), Sung–Ku Kwon et al, "Nano–Trenched Local Oxidation of Silicon Isolation Using Island Polysilicon Grains", pp. 639–642.

IEDM (1987), H. Schaber et al, "Process and Device Related Scaling Considerations for Polysilicon Emitter Bipolar Transistors", pp. 170–173.

Elsevier, Journal of Crystal Growth, vol. 157, (1995), P. Schittenhelm et al, "Self–organized MBE growth of Ge–rich SiGe dots on Si(100)", pp. 260–264.

*Primary Examiner*—Charles Bowers
*Assistant Examiner*—William M. Brewster
*Attorney, Agent, or Firm*—Hill & Simpson

[57] ABSTRACT

For manufacturing a capacitor that is essentially suited for DRAM arrangements, column structures that form an electrode of the capacitor are etched upon employment of a statistical mask that is produced without lithographic steps by nucleus formation of Si/Ge and subsequent selective epitaxy. Structure sizes below 100 nm can be realized in the statistical mask. Surface enlargement factors up to 60 are thus achieved.

5 Claims, 3 Drawing Sheets

PROCESS OF FORMING A SEMICONDUCTOR CAPACITOR INCLUDING FORMING A HEMISPHERICAL GRAIN STATISTICAL MASK WITH SILICON AND GERMANIUM

BACKGROUND OF THE INVENTION

Capacitors on a semiconductor basis are utilized in various integrated circuits such as, for example, dynamic memory cell arrangements, analog-to-digital and digital-to-analog converters as well as filter circuits. The problem of reducing the space requirement of the capacitor given unchanged capacitance must be solved in the manufacture of capacitors on a semiconductor basis in view of an increased integration density or reduced chip area.

The problem is especially serious in dynamic semiconductor memories wherein the required area of the generally employed single-transistor memory cell is being reduced from memory generation to memory generation with increasing memory density. At the same time, a certain minimum capacitance of the storage capacitor must be preserved.

A single-transistor memory cell of a dynamic semiconductor memory arrangement (DRAM memory arrangement) comprises a readout transistor and a capacitor. The information is stored in the capacitor in the form of an electrical charge that represents a logical quantity, 0 or 1. This information can be read out via a bit line by driving the readout transistor via a word line. The capacitor must comprises a minimum capacitance for reliable storage of the charge and, at the same time, distinguishability of the information read out. The lower limit for the capacitance of the storage capacitor is currently considered to be at 25 fF.

Up to the 1 Mbit generation, both the readout transistor as well as the capacitor were realized as planar components. Beginning with the 4 Mbit memory generation, a further reduction in the area of the memory cell was achieved by a three-dimensional arrangement of readout transistor and storage capacitor. One possibility therefor is comprised in realizing the storage capacitor in a trench (see, for example, B. K. Yamada et al., Proc. Intern. Electronic Devices and Material, IEDM 85, pp. 702 ff.). In this case, the electrodes of the storage capacitor are arranged along the surface of the trench. As a result thereof, the effective area of the storage capacitor, on which the capacitance is dependent, is enlarged compared to the space requirement at the surface of the substrate for the storage capacitor that corresponds to the crossection of the trench.

Another possibility for increasing the storage capacity given unchanged or reduced space requirement of the storage capacitor is comprised in implementing the storage capacitor as stacked capacitor. A structure of polysilicon, for example a crown structure or a cylinder, that is contacted with the substrate is thereby formed over the word lines. This polysilicon structure forms the storage node. It is provided with capacitor dielectric and capacitor plate. This design has the advantage that it is largely compatible with a logic process. The free space above the substrate surface is used for the storage capacitor. The entire cell area can thereby be covered by the polysilicon structure as long as the polysilicon structures for neighboring memory cells are insulated from one another.

European reference EP 0 415 530 B1 discloses a memory cell arrangement with a stacked capacitor as storage capacitor. The stacked capacitor comprises a polysilicon structure with a plurality of polysilicon layers arranged essentially parallel above one another that are connected to one another via at least one lateral support. These layers arranged like cooling ribs lead to a clear enlargement of the surface of the polysilicon structure compared to the projection of the polysilicon structure onto the substrate surface. The polysilicon structure is formed by alternating deposition of polysilicon layers and $SiO_2$ layers etchable selectively thereto on the surface of the substrate, structuring these layers, formation of the lateral support and selecting etching the $SiO_2$ layers out. The polysilicon structures are thereby arsenic-doped. Subsequently, silicon oxide is formed as capacitor dielectric by thermal oxidation, a cell plate of doped polysilicon being deposited thereon. The required mechanical stability of the polysilicon layers arranged parallel and the fact of having to introduce the capacitor dielectric and the cell plate between polysilicon layers arranged parallel limit the possible enlargement of the surface.

For enlarging the surface of a capacitor electrode, U.S. Pat. No. 5,254,503 has proposed that this be structured with the assistance of a mask of polysilicon nuclei that are formed by CVD deposition or with the assistance of a mask that was formed upon utilization of surface roughness. The structures in the mask are statistical in size and density, so that the enlargement of the surface and, thus, the achievable capacitance are difficult to control.

SUMMARY OF THE INVENTION

The invention is based on the problem of specifying a method for manufacturing a capacitor in a semiconductor arrangement, particularly for a DRAM arrangement, with which an increase of the packing density is achieved and wherein the capacitance of the capacitor is controllable.

For manufacturing the capacitor, a statistical mask with statistically distributed mask structures is formed on a substrate. The statistically distributed mask structures are produced without employment of lithographic processes by forming nuclei of silicon and/or germanium and by subsequent selective epitaxy. The formation of nuclei is thereby interrupted as soon as a predetermined density of the nuclei has been achieved. The size of the nuclei is subsequently set by selective epitaxy of silicon. The statistically distributed mask structures can therefore be manufactured with smaller structural sizes than correspond to the resolution limit of lithography and can nonetheless be controlled in terms of size and density.

Column structures whose crossection and distribution are determined by the arrangement of the statistically distributed mask structures are formed in the surface of the substrate by anisotropic etching. The statistical mask is thereby employed as etching mask. The column structures are connected to one another via a connector element at the column base. The material adjoining the column structures functions as connector element. When the column structures are formed in a layer of, for example, doped polysilicon, then this layer is not entirely etched through and the remaining, continuous residue of the layer forms the connector element.

At least the surface of the column structures and of the connector elements are electrically conductive. The column structures together with the connector element form the storage node of the capacitor. For completing the capacitor, a dielectric layer with essentially conformal edge coverage is produced, this at least covering the surface of the column structures and forming a capacitor dielectric. Finally, a conductive layer with essentially conformal edge coverage is deposited as capacitor plate.

The statistical mask is preferably formed with structural sizes in the range between 1 and 100 nm. I.e. the structural sizes of the statistically distributed mask structures lie in the range between 1 and 100 nm and the spacings between neighboring statistically distributed mask structures likewise lie on this order of magnitude. The statistically distributed mask structures can thereby be fashioned both as individual structures as well as as interconnected honeycomb structures. Packing densities in the range between $10^8$ and $10^{13}$ per cm$^2$ are thus achieved. This packing density corresponds to the packing density of the column structures that form the storage node in common with the connector element. The column structures effect a drastic enlargement of the surface of the storage node.

The aspect ratio of the column structures is also a defining factor for the surface enlargement of the storage node.

Based on a technology with a minimally manufacturable structural size of F=0.25 μm, a memory cell with a space requirement of 8 $F^2$ (F minimal structural size), a column diameter of 20 nm and an average column spacing of 20 nm, a column height of 400 nm given an aspect ratio of 20 and a capacitance of 25 fF derive given employment of a capacitor dielectric composed of a triple layer of silicon oxide, silicon nitride and silicon oxide. For a 1 Gbit DRAM, an aspect ratio of 45 is required in order to achieve a capacitance of 25 fF. Higher capacitances can be achieved in this method by employing materials with a high relative dielectric constant, particularly greater than 100.

It is advantageous for forming the statistical mask to form nuclei at the surface of the substrate with the assistance of a CVD process. What is thereby exploited is that the nucleus formation in CVD processes can be influenced by setting the process parameters. For forming the statistical mask, the parameters in the CVD process are set such that the nucleus formation is greatly retarded, so that individual, isolated nuclei initially form.

The nuclei are preferably formed by a CVD deposition wherein a process gas that contains at least one of the compounds $SiH_4$, $GeH_4$ and $H_2$ is employed.

It has been found that isolated germanium nuclei with structural sizes in the range from 10 to 100 nm are formed by employing a process gas with $GeH_4$ in a carrier gas, for example $H_2$, given pressures in the range from 1 to 100 mbar and temperatures in the range of 500–700° C.

It is especially advantageous to form the nuclei by CVD deposition upon employment of a process gas containing $SiH_4$, $GeH_4$ and $H_2$. The perception was thereby utilized that the addition of $GeH_4$ retards the nucleus formation of silicon nuclei in a CVD deposition upon employment of a process gas that contains mainly $SiH_4$ in a carrier gas, for example $H_2$. The nucleus density can therefore be set via the addition of $GeH_4$.

It is advantageous in view of high selectivities of the etching in the formation of the column structures to provide a mask layer in the substrate, this being structured upon employment of the statistical mask as etching mask and, together with the statistical mask, subsequently acting as etching mask in the formation of the column structures. The mask layer is preferably formed of a material that is suitable for a hard mask. For example, TEOS-$SiO_2$ or $Si_3N_4$ are included therein.

For example, a semiconductor substrate, preferably of monocrystalline silicon, or an SOI substrate is suited as substrate.

The method for manufacturing the capacitor can be especially advantageously employed in the manufacture of a storage capacitor of a DRAM arrangement. The capacitor can thereby be fashioned both as trench capacitor in the substrate as well as as stacked capacitor. The manufacture of the capacitor as stacked capacitor is advantageous with respect to the surface enlargement. In this case, the substrate comprises a semiconductor substrate with selection transistors, bit lines, word lines, an insulating layer that covers the selection transistors, the bit lines and the word lines and that is preferably planarized, and comprises a conductive layer, preferably of doped polysilicon in which the storage nodes, which are respectively composed of column structures and connector element, are formed according to the inventive method. Over and above this, the insulating layer comprises contacts between the storage nodes to be manufactured and source zones of the selection transistors.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several FIGS. of which would like reference numerals identify like elements, and in which:

DESCRIPTION OF THE PREFERRED EMBODIMENTS

Figure 1:
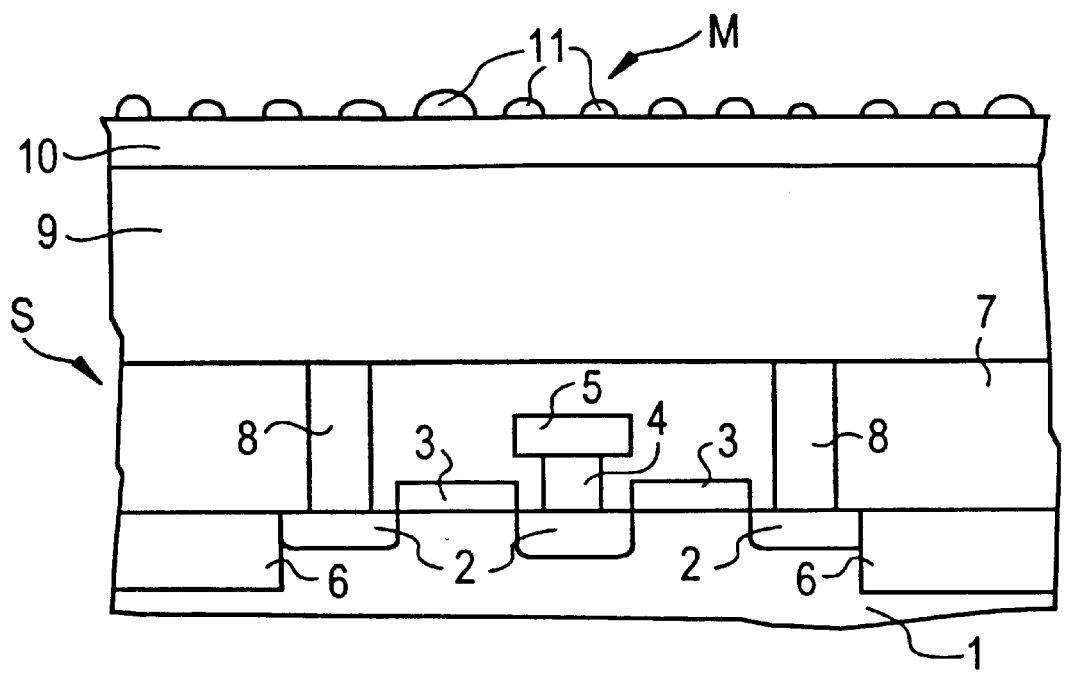
FIG. 1 shows a substrate with readout transistors, word lines, bit lines, a doped polysilicon layer, a mask layer and statistically distributed mask structures.

A substrate S comprises a wafer of monocrystalline silicon 1 in which selection transistors with respective source-drain zones 2, gate oxide and gate electrodes fashioned as word lines 3 are provided. The selection transistors are respectively arranged in pairs, whereby selection transistors belonging to a pair comprises a common source-drain zone 2 that is connected via a bit line contact 4 to a bit line 5. Neighboring selection transistor pairs in the silicon wafer 1 are insulated from one another by insulation structures 6. For example, LOCOS insulations or insulation trenches (shallow trench insulation) are employed as insulation structure 6.

The substrate S further comprises an insulating layer 7 with planar surface that completely covers the selection transistors, the word lines 3 and the bit lines 5. Storage node contacts 8 that respectively onto those source-drain zones 2 that are not provided with a bit line contact 4 are provided in the insulating layer 7.

Further, the substrate S comprises a doped polysilicon layer 9 that is arranged at the surface of the insulating layer 7. The doped polysilicon layer 9 comprises a thickness of, for example, 500 nm. It is, for example, n-doped with a dopant concentration of $10^{21}/cm^3$. It is formed, for example, by in situ doped deposition in a CVD processor by undoped deposition and subsequent doping by implantation, occupation or diffusion. The surface of the doped polysilicon layer 9 forms the surface of the substrate S.

A mask layer of, for example, $SiO_2$ is applied with a layer thickness of, for example, 20 nm onto the surface of the doped polysilicon layer 9. All materials that are suitable as etching mask for structuring the doped polysilicon layer 9 come into consideration for the mask layer 10.

Statistically distributed mask structures in the form of nuclei are formed on the surface of the mask layer 10 during a vapor phase deposition in an epitaxy system. An atmosphere of $H_2$ and $SiH_4$ is employed as process gas, whereby $H_2$ forms the carrier gas. The atmosphere also comprises $GeH_4$ that is added for retarding the nucleation process. The partial pressure of $SiH_4$ and $GeH_4$ lies in the range from $10^{-3}$ to 1 mbar; the partial pressure of $H_2$ lies in the range from 1 to 100 mbar. The deposition is implemented in the temperature range between 500° C. and 700° C. Given these process conditions, individual silicon/germanium nuclei that determine the distribution and density of the statistically distributed mask structures form at the surface of the mask layer 10. The nucleation process is aborted as soon as the density of the silicon/germanium nuclei has reached a predetermined density of approximately $5 \times 10^{10}/cm^2$.

The process conditions are subsequently modified in order to designationally set the size of the silicon/germanium nuclei. To that end, process conditions as used for the selective epitaxy are set. A further nucleus formation at the surface of the mask layer 10 is suppressed given these process conditions. The selective epitaxy ensues, for example, with a gas mixture of $H_2$ and $SiH_2Cl_2$ in the temperature range between 600° C. and 800° C. Over and above this, $GeH_4$ can be added to this gas mixture in order to set the material composition of the nuclei and, thus, material properties such as, for example, etching selectivities and the like.

The deposition process is aborted as soon as the diameter of the nuclei corresponds to a predetermined value. The nuclei form the statistically distributed mask structures 11 that form a statistical mask M with one another.

Figure 2:
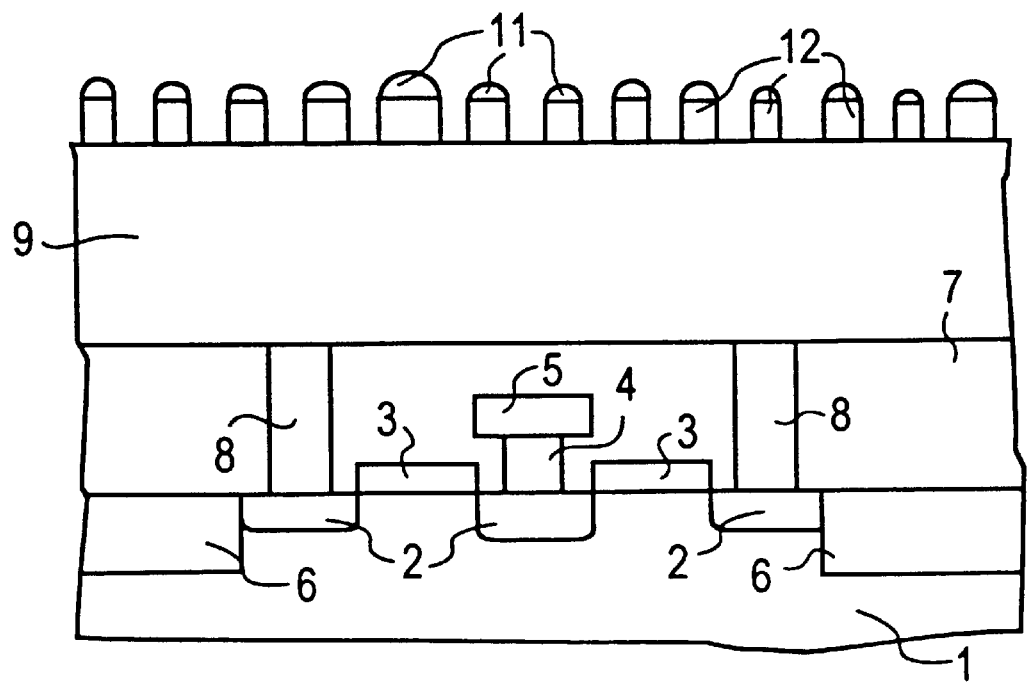
FIG. 2 shows the substrate after structuring of the mask layer.

The mask layer 10 is structured in an anisotropic etching process that attacks the mask layer 10 selectively relative to the statistically distributed mask structures 11. hard mask 12 is thereby formed from the mask layer 10 (see FIG. 2). The anisotropic etching is implemented, for example, with $CHF_3/CF_4$.

An anisotropic etching process that attacks silicon selectively relative to $SiO_2$ is subsequently implemented. Column structures 91 are thereby formed in the doped polysilicon layer 9. At the same time, the statistically distributed mask structures 11, which are composed of silicon or silicon germanium, are removed. The anisotropic etching process is implemented, for example, with HBr.

Figure 3:
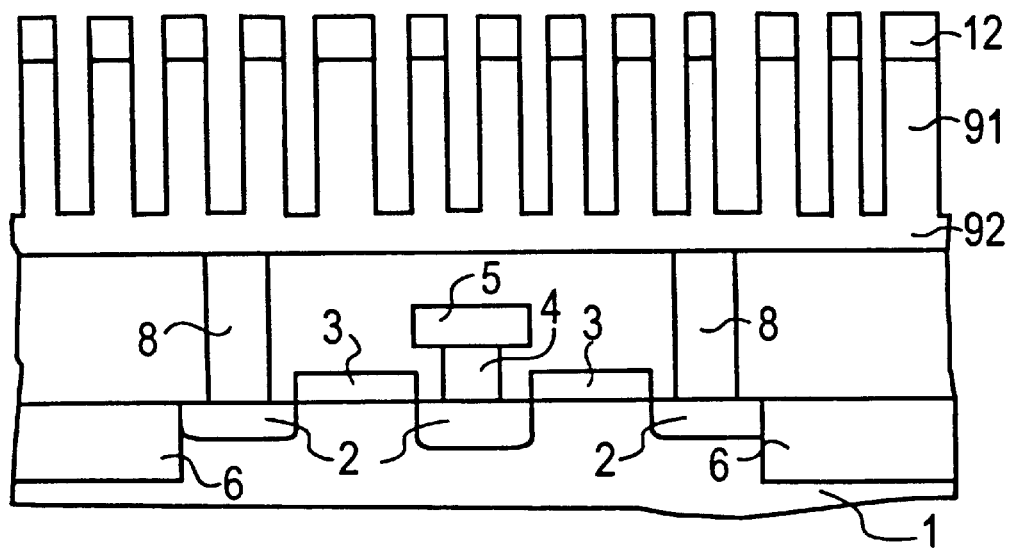
FIG. 3 shows the substrate after formation of column structures in the doped polysilicon layer.

The column structures 91 exhibit a height that is less than corresponds to the thickness of the doped polysilicon layer 9 (see FIG. 3). The remaining, continuous residue of the doped polysilicon layer 9 forms a connector element 92 via which the column structures 91 are connected to one another. The column structures 91 comprise a height of, for example, 400 nm.

The density, the crossection and the arrangement of the column structures 91 are predetermined by the arrangement of the statistically distributed mask structures 11 in the statistical mask M. Given a column diameter of 20 nm, a column height of 400 nm, an average column spacing of 20 nm, an area enlargement by the factor 16 thereby derives.

Figure 4:
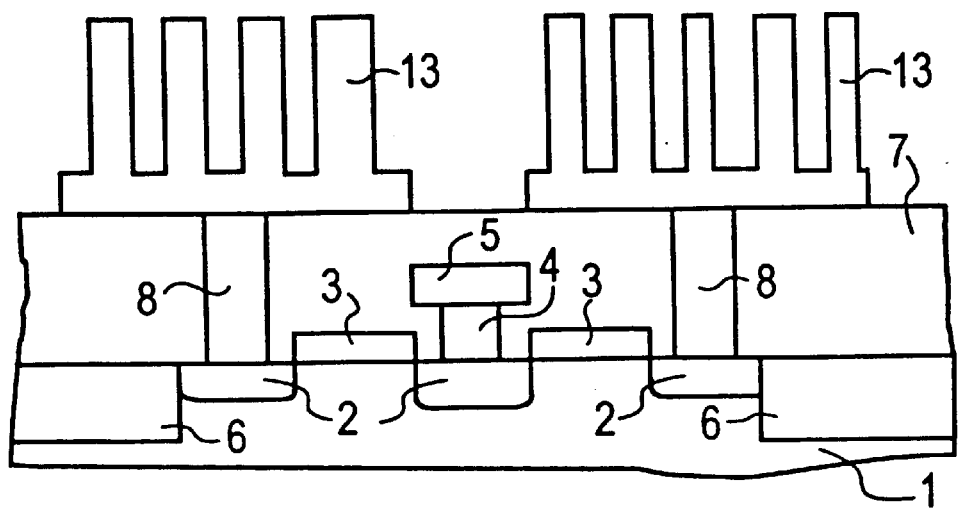
FIG. 4 shows the substrate after formation of individual storage nodes.

The hard mask 12 is removed selectively relative to silicon in an isotropic etching process, for example in an HF dip. Subsequently, an anisotropic etching process is implemented with the assistance of photolithographic methods, whereby trenches that respectively extend onto the surface of the insulating layer 7 and that define a storage node 13 for every selection transistor are generated in the column structures 91 and the connector element 92. The storage node 13 is respectively isolated from the neighboring storage node 13 and is electrically connected via the storage node contact 8 to the appertaining source-drain zone 2 (see FIG. 4). The anisotropic etching process is implemented, for example, with HBr.

The lithography step and the anisotropic etching process for separating the individual storage nodes 13 can also ensue before the formation of the column structures 91.

The surface of the storage nodes 13 is subsequently provided with a capacitor dielectric 14. For example, $SiO_2$ in a thickness of 5 nm, a triple layer of $SiO_2$, $Si_3N_4$ and $SiO_2$ with a thickness of respectively approximately 2 nm is suited as capacitor dielectric 14. In order to achieve higher capacitances, it is expedient to form the capacitor dielectric of a material with a relative dielectric constant $\epsilon_r > 50$. The following materials come into consideration therefor: $TiO_2$, $Ba_xSr_{1-x}TiO_3$.

Figure 5:
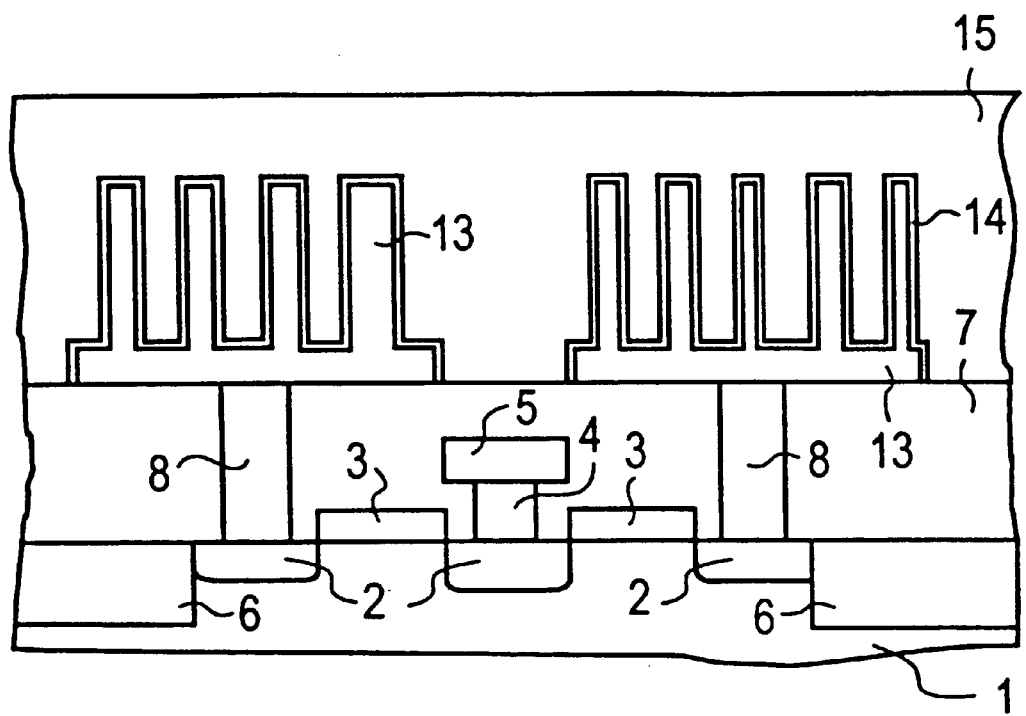
FIG. 5 shows the substrate after completion of storage capacitors by producing a capacitor dielectric and a capacitor plate.

A conductive layer of, for example, doped polysilicon that forms a capacitor plate 15 is subsequently deposited surface-wide (see FIG. 5). The capacitor plate 15 is formed, for example, of doped polysilicon by in situ doped deposition. The interspaces between neighboring column structures 91 are thereby completely filled up. For example, the capacitor plate 15 is n-doped with a dopant concentration of $10^{21}/cm^3$.

The method is not limited to the example of the substrate selected here. All substrates in whose surface column structures can be etched are suitable for the implementation of the method.

The invention is not limited to the particular details of the method depicted and other modifications and applications are contemplated. Certain other changes may be made in the above described method without departing from the true spirit and scope of the invention herein involved. It is intended, therefore, that the subject matter in the above depiction shall be interpreted as illustrative and not in a limiting sense.

What is claimed is:

1. A method for manufacturing a capacitor in a semiconductor arrangement, comprising the steps of:

forming a statistical mask with statistically distributed mask structure on a substrate;

forming nuclei of silicon and germanium for formation of the statistical mask;

interrupting the nucleus formation as soon as a predetermined density of the nuclei is reached;

setting a size of the nuclei by selective epitaxy of at least one of silicon and germanium;

forming column structures that are connected to one another at a column base via a connector element using the statistical mask;

at least the surface of the column structures and of the connector element being electrically conductive;

generating a dielectric layer with substantially conformal edge coverage, that at least covers the surface of the column structures for forming a capacitor dielectric;

depositing a conductive layer with substantially conformal edge coverage for forming a capacitor plate.

2. The method according to claim 1, wherein the statistical mask is formed with structure sizes in a range between 1 nm and 100 nm.

3. The method according to claim 1, wherein the nuclei for CVD deposition are formed using a process gas that contains at least one of the compounds $SiH_4$, $GeH_4$, $N_2$, Ar, He and $H_2$.

4. The method according to claim 1, wherein the substrate has a mask layer that is structured using the statistical mask as etching mask and that is utilized in common with the statistical mask as etching mask in the formation of the column structures.

5. The method according to claim 1, wherein the column structures and the connector element are formed of doped silicon;

wherein the capacitor dielectric is formed of at least one of $SiO_2$ and $Si_3N_4$ or of a dielectric material with a relative dielectric constant $\epsilon_r > 50$;

wherein the capacitor plate is formed of doped polysilicon.

* * * * *